(12) United States Patent
Satoh et al.

(10) Patent No.: US 8,357,597 B2
(45) Date of Patent: *Jan. 22, 2013

(54) PROCESS FOR PRODUCING $SI_{(1-v-w-x)}C_wAL_xN_v$ BASE MATERIAL, PROCESS FOR PRODUCING EPITAXIAL WAFER, $SI_{(1-v-w-x)}C_wAL_xN_v$ BASE MATERIAL, AND EPITAXIAL WAFER

(75) Inventors: Issei Satoh, Itami (JP); Michimasa Miyanaga, Osaka (JP); Shinsuke Fujiwara, Itami (JP); Hideaki Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/989,039

(22) PCT Filed: Apr. 17, 2009

(86) PCT No.: PCT/JP2009/057723
§ 371 (c)(1),
(2), (4) Date: Oct. 21, 2010

(87) PCT Pub. No.: WO2009/131064
PCT Pub. Date: Oct. 29, 2009

(65) Prior Publication Data
US 2011/0042788 A1 Feb. 24, 2011

(30) Foreign Application Priority Data

Apr. 24, 2008 (JP) ................................. 2008-114467
Mar. 10, 2009 (JP) ................................. 2009-056915

(51) Int. Cl.
*H01L 21/20* (2006.01)

(52) U.S. Cl. ................ 438/487; 438/486; 257/E21.461; 257/E29.1; 257/E29.089

(58) Field of Classification Search .................. 438/486, 438/487
See application file for complete search history.

(56) References Cited

U.S. PATENT DOCUMENTS
4,382,837 A 5/1983 Rutz
(Continued)

FOREIGN PATENT DOCUMENTS
JP 61-291495 12/1986
(Continued)

OTHER PUBLICATIONS

S. Huang et al., "Synthesis and Property Study of Nanoparticle Quaternary Semiconductor SiCAlN Films with Co-sputtering Under Lower Temperature", Surf. Rev. Lett., 2005, vol. 12, No. 3, pp. 397-400.

(Continued)

*Primary Examiner* — Alexander Ghyka
(74) *Attorney, Agent, or Firm* — Drinker Biddle & Reath LLP

(57) ABSTRACT

$Si_{(1-v-w-x)}C_wAl_xN_v$ crystals in a mixed crystal state are formed. A method for manufacturing an easily processable $Si_{(1-v-w-x)}C_wAl_xN_v$ substrate, a method for manufacturing an epitaxial wafer, a $Si_{(1-v-w-x)}C_wAl_xN_v$ substrate, and an epitaxial wafer are provided. A method for manufacturing a $Si_{(1-v-w-x)}C_wAl_xN_v$ substrate 10a includes the following steps. First, a Si substrate 11 is prepared. A $Si_{(1-v-w-x)}C_wAl_xN_v$ layer 12 ($0<v<1$, $0<w<1$, $0<x<1$, and $0<v+w+x<1$) is then grown on the Si substrate 11 by a pulsed laser deposition method.

3 Claims, 6 Drawing Sheets

U.S. PATENT DOCUMENTS

| | | | |
|---|---|---|---|
| 6,086,672 | A | 7/2000 | Hunter |
| 2003/0056719 | A1* | 3/2003 | Kouvetakis et al. ......... 117/104 |
| 2008/0277778 | A1* | 11/2008 | Furman et al. ............... 257/713 |
| 2009/0101928 | A1* | 4/2009 | Kim et al. ...................... 257/98 |
| 2011/0031534 | A1* | 2/2011 | Satoh et al. .................. 257/201 |
| 2011/0039071 | A1* | 2/2011 | Satoh et al. .................. 428/155 |

FOREIGN PATENT DOCUMENTS

| | | |
|---|---|---|
| JP | 04-167477 | 6/1992 |
| JP | 2005-506695 | 3/2005 |

OTHER PUBLICATIONS

J. Tolle et al., "Growth of SiCAlN on Si(111) via a crystalline oxide interface", Appl. Phys. Lett., Sep. 16, 2002, vol. 81, No. 12, pp. 2181-2183.

R. Roucka et al., "Low-temperature growth of SiCAlN films of high hardness on Si(111) substrates", Appl. Phys. Lett., Oct. 29, 2001, vol. 79, No. 18, pp. 2880-2882.

Z. Gu et al., "Sublimation growth of aluminum nitride on silicon carbide substrate with aluminum nitride-silicon carbide alloy transition layer," Journal of Materials Research, Mar. 2007, pp. 675-680, vol. 22, No. 3.

I. Jenkins et al., "Growth of solid solutions of aluminum nitride and silicon carbide by metalorganic chemical vapor deposition," Journal of Crystal Growth, 1993, pp. 375-378, vol. 128.

R.S. Kern et al, "Growth of pseudomorphic heterostructures and solid solutions in the AlN-SiC system by plasma-assisted, gas-source molecular beam epitaxy," Institute of Physics Conference Series, 1993, pp. 389-392, No. 137, Chapter 4.

J. H. Edgar et al., "Interface properties of an AlN/(AlN)$_x$(SiC)$_{1-x}$/4H-SiC heterostructure," Physica Status Solidi (a), 2006, pp. 3720-3725, vol. 203, No. 15.

J.H. Edgar et al., "Metalorganic chemical vapor deposition of (AlN)$_x$(SiC)$_{1-x}$ alloy films", Inst. Phys. Conf. Ser., No. 137, Chapter 4, pp. 401-404, 1993.

J.S. Pelt et al., "Characterization of crystalline SiC films grown by pulsed laser deposition", Thin Solid Films, vol. 371, pp. 72-79, 2000.

A. Avramescu et al., "Growth of AlN-SiC solid solutions by sequential supply epitaxy", Journal of Crystal Growth, vol. 234, pp. 435-439, 2002.

\* cited by examiner

PROCESS FOR PRODUCING $SI_{(1-v-w-x)}C_wAL_xN_v$ BASE MATERIAL, PROCESS FOR PRODUCING EPITAXIAL WAFER, $SI_{(1-v-w-x)}C_wAL_xN_v$ BASE MATERIAL, AND EPITAXIAL WAFER

The present invention relates to a method for manufacturing a $Si_{(1-v-w-x)}C_wAl_xN_v$ substrate, a method for manufacturing an epitaxial wafer, a $Si_{(1-v-w-x)}C_wAl_xN_v$ substrate, and an epitaxial wafer.

BACKGROUND ART $Al_{(1-y-z)}Ga_yIn_zN$ ($0 \leq y \leq 1$, $0 \leq z \leq 1$, and $0 \leq y+z \leq 1$) crystals, such as aluminum nitride (AlN) crystals, having an energy bandgap of 6.2 eV, a thermal conductivity of approximately 3.3 $WK^{-1}cm^{-1}$, and high electrical resistance have been used as materials for semiconductor devices, such as short-wavelength optical devices and power electronic devices. Conventionally, such crystals have been grown on a base substrate, for example, by a vapor phase epitaxy method. $Si_{(1-v-w-x)}C_wAl_xN_v$ substrates have received attention as base substrates on which such materials are grown. For example, U.S. Pat. No. 4,382,837 (Patent Literature 1), U.S. Pat. No. 6,086,672 (Patent Literature 2), and Japanese Unexamined Patent Application Publication (Translation of PCT Application) No. 2005-506695 (Patent Literature 3) describe a method for manufacturing a $Si_{(1-v-w-x)}C_wAl_xN_v$ substrate.

Patent Literature 1 discloses that a raw material is heated at a temperature in the range of 1900° C. to 2020° C. for sublimation, thereby growing $(SiC)_{(1-x)}(AlN)_x$ crystals on $Al_2O_3$ (sapphire). Patent Literature 2 discloses that a raw material is heated at a temperature in the range of 1810° C. to 2492° C. to grow $(SiC)_{(1-x)}(AlN)_x$ crystals on silicon carbide (SiC) at a temperature in the range of 1700° C. to 2488° C. Patent Literature 3 discloses that $(SiC)_{(1-x)}(AlN)_x$ crystals are grown on silicon (Si) at a raw material gas temperature in the range of 550° C. to 750° C. by a molecular-beam epitaxy (MBE) method.

CITATION LIST

Patent Literature

PTL 1: U.S. Pat. No. 4,382,837
PTL 2: U.S. Pat. No. 6,086,672
PTL 3: Japanese Unexamined Patent Application Publication (Translation of PCT Application) No. 2005-506695

SUMMARY OF INVENTION

Technical Problem

In Patent Literatures 1 and 2, however, $(SiC)_{(1-x)}(AlN)_x$ crystals are grown on an $Al_2O_3$ substrate and a SiC substrate. Since $Al_2O_3$ substrates and SiC substrates are chemically very stable, it is difficult to process these substrates by wet etching or the like. Thus, the problem is that it is difficult to decrease the thickness of an $Al_2O_3$ substrate and a SiC substrate and to remove an $Al_2O_3$ substrate and a SiC substrate.

$(SiC)_{(1-x)}(AlN)_x$ crystals are grown by a sublimation method in Patent Literatures 1 and 2 and by a MBE method in Patent Literature 3. FIGS. 10 and 11 are schematic cross-sectional views of $(SiC)_{(1-x)}(AlN)_x$ crystals grown in Patent Literatures 1 to 3. FIGS. 10 and 11 show that, in a $(SiC)_{(1-x)}(AlN)_x$ layer 112 grown by a sublimation method or a MBE method, SiC layers 112a and AlN layers 112b are often layered, as illustrated in FIG. 10, or a SiC layer 112a is often interspersed with aggregated AlN layers 112b, as illustrated in FIG. 11. Thus, it was found that a mixed crystal state of four elements Si, carbon (C), aluminum (Al), and nitrogen (N) cannot be formed in a $(SiC)_{(1-x)}(AlN)_x$ layer 112.

In view of the problems described above, it is an object of the present invention to form $Si_{(1-v-w-x)}C_wAl_xN_v$ crystals in a mixed crystal state and provide a method for manufacturing an easily processable $Si_{(1-v-w-x)}C_wAl_xN_v$ substrate, a method for manufacturing an epitaxial wafer, a $Si_{(1-v-w-x)}C_wAl_xN_v$ substrate, and an epitaxial wafer.

Solution to Problem

The present inventor found that the reason that $Si_{(1-v-w-x)}C_wAl_xN_v$ crystals in a mixed crystal state could not be formed is that the sublimation method and the MBE method grow $Si_{(1-v-w-x)}C_wAl_xN_v$ crystals in an equilibrium state. The present inventor also found that because SiC and AlN are stable in a $Si_{(1-v-w-x)}C_wAl_xN_v$ layer grown in an equilibrium state, Si bonds to C, and Al bonds to N.

Thus, a method for manufacturing a $Si_{(1-v-w-x)}C_wAl_xN_v$ substrate according to the present invention includes the following steps. First, a Si substrate is prepared. A $Si_{(1-v-w-x)}C_wAl_xN_v$ layer ($0<v<1$, $0<w<1$, $0<x<1$, and $0<v+w+x<1$) is then grown on the Si substrate by a pulsed laser deposition (PLD) method.

In accordance with a method for manufacturing a $Si_{(1-v-w-x)}C_wAl_xN_v$ substrate according to the present invention, a $Si_{(1-v-w-x)}C_wAl_xN_v$ layer ($0<v<1$, $0<w<1$, $0<x<1$, and $0<v+w+x<1$) is grown by a PLD method. A raw material for the $Si_{(1-v-w-x)}C_wAl_xN_v$ layer can be irradiated with a laser beam to generate plasma. The plasma can be supplied to the surface of the Si substrate. Thus, the $Si_{(1-v-w-x)}C_wAl_xN_v$ layer can be grown in a non-equilibrium state. Unlike the equilibrium state, this growth condition is not a stable state. Si can therefore bond to C and N, and Al can bond to C and N. This can grow a $Si_{(1-v-w-x)}C_wAl_xN_v$ layer formed of a mixed crystal of four elements Si, C, Al, and N.

The $Si_{(1-v-w-x)}C_wAl_xN_v$ layer is grown on the Si substrate. Si substrates can be easily cleaved and easily etched with an acid. It is therefore easy to reduce the thickness of a Si substrate or remove a Si substrate. Thus, an easily processable $Si_{(1-v-w-x)}C_wAl_xN_v$ substrate can be manufactured.

Preferably, the method for manufacturing a $Si_{(1-v-w-x)}C_wAl_xN_v$ substrate described above further includes the step of removing the Si substrate after the growing step.

As described above, the Si substrate can be easily processed. The Si substrate can therefore be easily removed. A $Si_{(1-v-w-x)}C_wAl_xN_v$ substrate that includes no Si substrate and a $Si_{(1-v-w-x)}C_wAl_xN_v$ layer having a reduced number of cracks can be easily manufactured.

A method for manufacturing an epitaxial wafer according to the present invention includes the steps of manufacturing a $Si_{(1-v-w-x)}C_wAl_xN_v$ substrate by any of the methods for manufacturing a $Si_{(1-v-w-x)}C_wAl_xN_v$ substrate described above and growing an $Al_{(1-y-z)}Ga_yIn_zN$ layer ($0 \leq y \leq 1$, $0 \leq z \leq 1$, and $0 \leq y+z \leq 1$) on the $Si_{(1-v-w-x)}C_wAl_xN_v$ layer.

A $Si_{(1-v-w-x)}C_wAl_xN_v$ layer in a mixed crystal state can be manufactured by a method for manufacturing an epitaxial wafer according to the present invention. An $Al_{(1-y-z)}Ga_yIn_zN$ layer having uniform crystallinity can therefore be grown on the $Si_{(1-v-w-x)}C_wAl_xN_v$ layer. The lattice matching and thermal expansion coefficient of the $Al_{(1-y-z)}Ga_yIn_zN$ layer are similar to the lattice matching and thermal expansion coefficient of the $Si_{(1-v-w-x)}C_wAl_xN_v$ layer. This can improve the crystallinity of the $Al_{(1-y-z)}Ga_yIn_zN$ layer. In an epitaxial wafer including a Si substrate, since the Si substrate can be easily processed, the Si substrate can be easily removed from the epitaxial wafer.

A $Si_{(1-v-w-x)}C_wAl_xN_v$ substrate according to the present invention is a $Si_{(1-v-w-x)}C_wAl_xN_v$ substrate including a $Si_{(1-v-w-x)}C_wAl_xN_v$ layer (0<v<1, 0<w<1, 0<x<1, and 0<v+w+x<1), wherein the $Si_{(1-v-w-x)}C_wAl_xN_v$ layer has a diffraction peak between a SiC diffraction peak and an AlN diffraction peak, as determined by an X-ray diffraction (XRD) method.

A $Si_{(1-v-w-x)}C_wAl_xN_v$ substrate according to the present invention manufactured by the method for manufacturing a $Si_{(1-v-w-x)}C_wAl_xN_v$ substrate according to the present invention described above includes a $Si_{(1-v-w-x)}C_wAl_xN_v$ layer grown in a non-equilibrium state. In the $Si_{(1-v-w-x)}C_wAl_xN_v$ layer, Si bonds to C and N, and Al bonds to C and N. This can grow a $Si_{(1-v-w-x)}C_wAl_xN_v$ layer formed of a mixed crystal of four elements Si, C, Al, and N. Thus, the $Si_{(1-v-w-x)}C_wAl_xN_v$ layer can have a diffraction peak between a SiC diffraction peak and an AlN diffraction peak.

Preferably, the $Si_{(1-v-w-x)}C_wAl_xN_v$ substrate further includes a Si substrate having a main surface, and the $Si_{(1-v-w-x)}C_wAl_xN_v$ layer is formed on the main surface of the Si substrate.

In the case that the $Si_{(1-v-w-x)}C_wAl_xN_v$ layer has a small thickness, the $Si_{(1-v-w-x)}C_wAl_xN_v$ substrate may further include a Si substrate if necessary. This is particularly advantageous when a Si substrate must be removed from the $Si_{(1-v-w-x)}C_wAl_xN_v$ layer, because the Si substrate can be easily processed.

An epitaxial wafer according to the present invention includes any of the $Si_{(1-v-w-x)}C_wAl_xN_v$ substrates described above and an $Al_{(1-y-z)}Ga_yIn_zN$ layer (0≦y≦1, 0z≦1, and 0≦y+z≦1) formed on the $Si_{(1-v-w-x)}C_wAl_xN_v$ layer.

In an epitaxial wafer according to the present invention, an $Al_{(1-y-z)}Ga_yIn_zN$ layer is formed on a $Si_{(1-v-w-x)}C_wAl_xN_v$ layer in a mixed crystal state. The $Al_{(1-y-z)}Ga_yIn_zN$ layer can therefore have uniform crystallinity. In an epitaxial wafer including a Si substrate, since the Si substrate can be easily processed, the Si substrate can be easily removed from the epitaxial wafer.

Advantageous Effects of Invention

In accordance with a method for manufacturing a $Si_{(1-v-w-x)}C_wAl_xN_v$ substrate, a method for manufacturing an epitaxial wafer, a $Si_{(1-v-w-x)}C_wAl_xN_v$ substrate, and an epitaxial wafer according to the present invention, a $Si_{(1-v-w-x)}C_wAl_xN_v$ layer is grown on a Si substrate by a PLD method. Thus, an easily processable $Si_{(1-v-w-x)}C_wAl_xN_v$ substrate in a mixed crystal state can be manufactured by growing a $Si_{(1-v-w-x)}C_wAl_xN_v$ layer in a non-equilibrium state.

DESCRIPTION OF EMBODIMENTS

Figure 1:
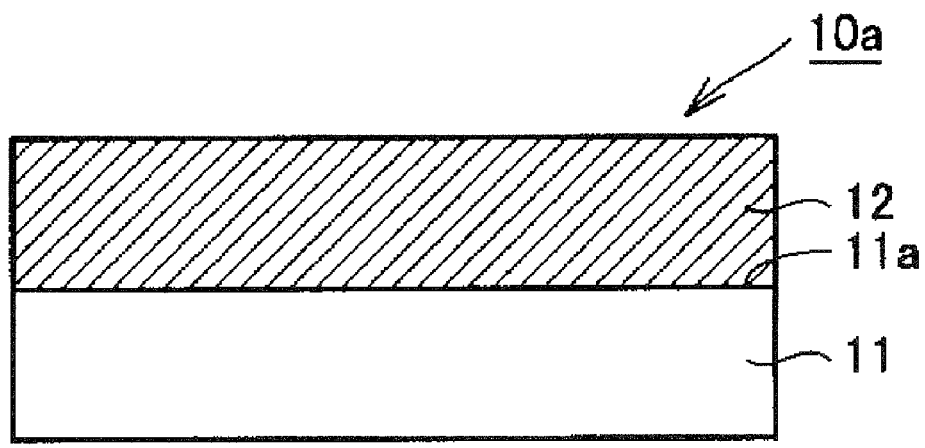
FIG. 1 is a schematic cross-sectional view of a $Si_{(1-v-w-x)}C_wAl_xN_v$ substrate according to a first embodiment of the present invention.

Embodiments of the present invention will be described below with reference to the drawings. In the drawings, identical or similar elements are denoted by like references and will not be described again.

First Embodiment

FIG. 1 is a schematic cross-sectional view of a $Si_{(1-v-w-x)}C_wAl_xN_v$ substrate according to the present embodiment. First, a $Si_{(1-v-w-x)}C_wAl_xN_v$ substrate 10a according to the present embodiment will be described below with reference to FIG. 1.

As illustrated in FIG. 1, the $Si_{(1-v-w-x)}C_wAl_xN_v$ substrate 10a according to the present embodiment includes a Si substrate 11 and a $Si_{(1-v-w-x)}C_wAl_xN_v$ layer 12 (0>v<1, 0<w<1, 0<x<1, and 0<v+w+x<1) formed on the main surface 11a of the Si substrate 11. In the $Si_{(1-v-w-x)}C_wAl_xN_v$ layer 12, the component ratio 1-v-w-x denotes the molar ratio of Si, w denotes the molar ratio of C, x denotes the molar ratio of Al, and v denotes the molar ratio of N.

Figure 2:
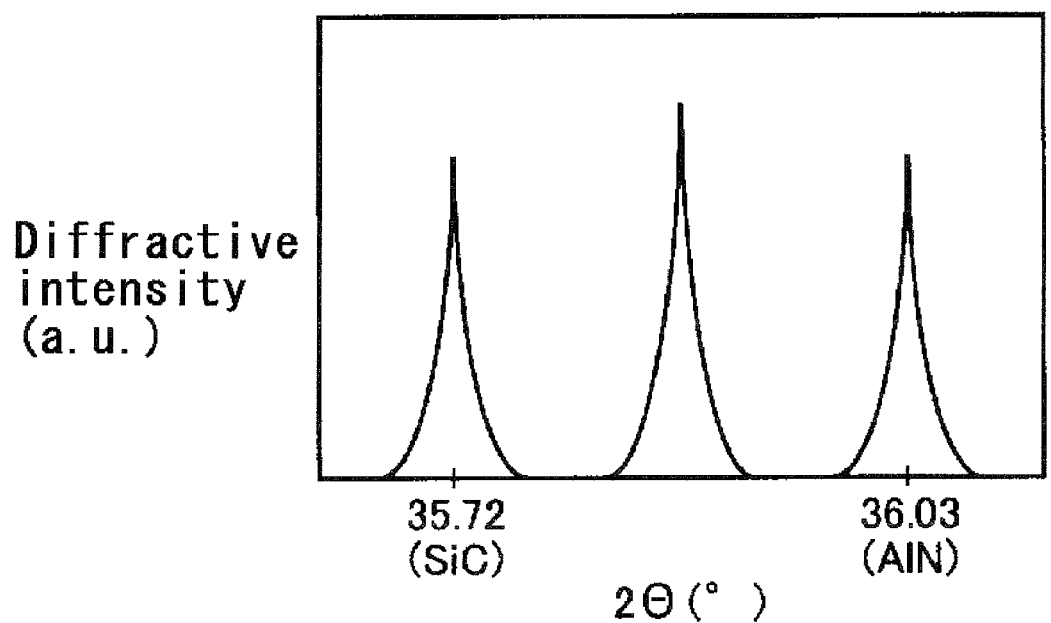
FIG. 2 is a schematic view of diffraction peaks in the XRD of a $Si_{(1-v-w-x)}C_wAl_xN_v$ layer according to the first embodiment of the present invention.
Figure 3:
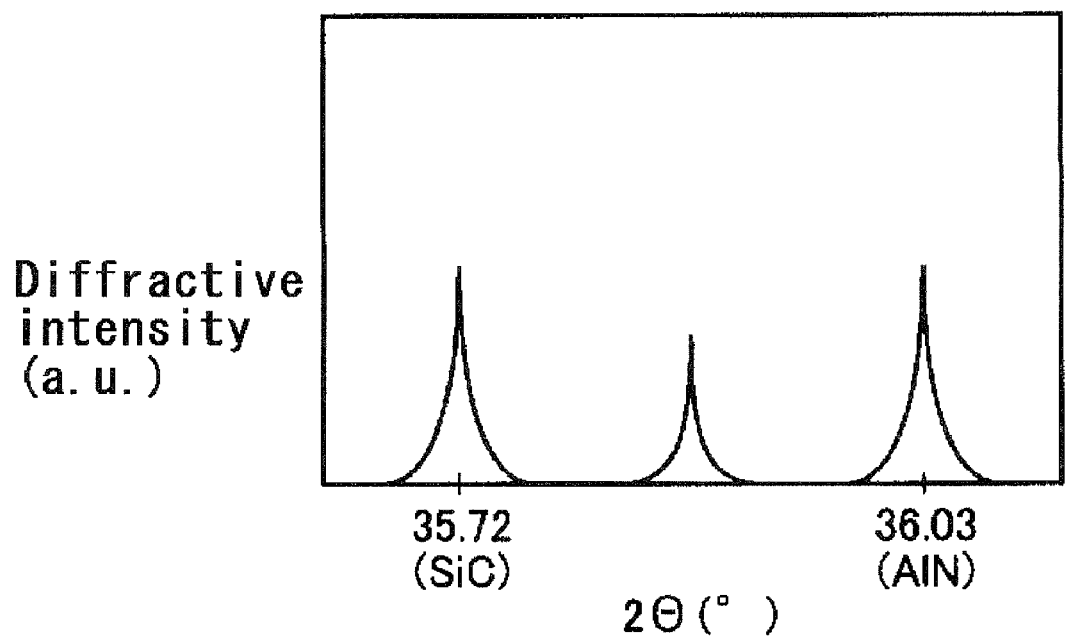
FIG. 3 is a schematic view of diffraction peaks in the XRD of a $Si_{(1-v-w-x)}C_wAl_xN_v$ layer according to the first embodiment of the present invention.
Figure 4:
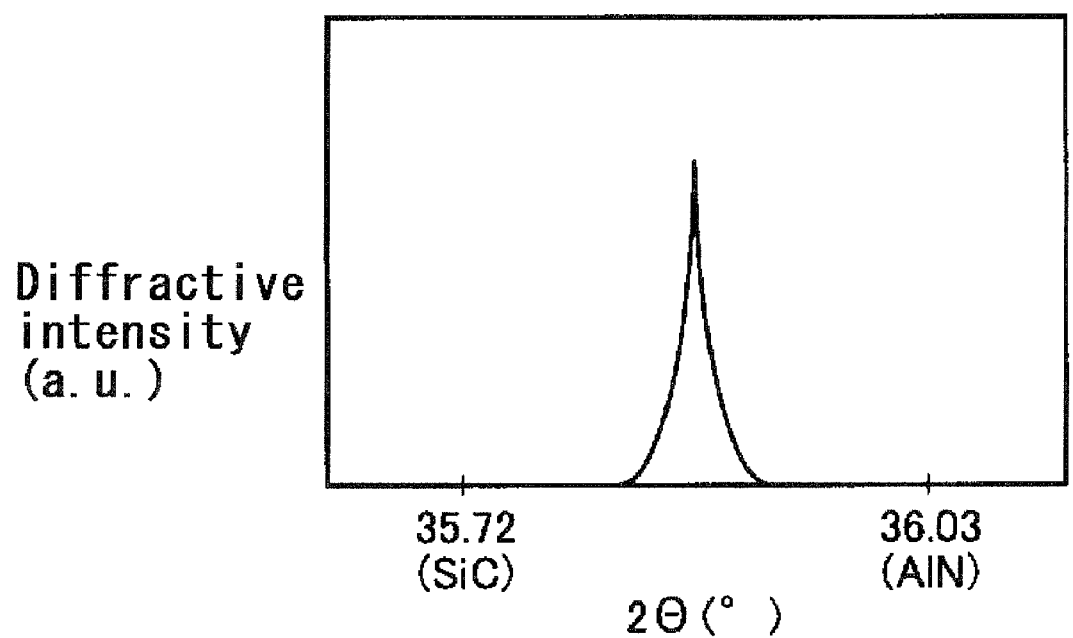
FIG. 4 is a schematic view of diffraction peaks in the XRD of a $Si_{(1-v-w-x)}C_wAl_xN_v$ layer according to the first embodiment of the present invention.

FIGS. 2 to 4 are schematic views of diffraction peaks of the $Si_{(1-v-w-x)}C_wAl_xN_v$ layer according to the present embodiment measured by an XRD method. As illustrated in FIGS. 2 to 4, the $Si_{(1-v-w-x)}C_wAl_xN_v$ layer 12 has a diffraction peak between a SiC diffraction peak and an AlN diffraction peak as determined by the XRD method. The diffraction peaks of the materials as determined by the XRD method have their inherent values. For example, under measurement conditions where the target is copper (Cu), the tube voltage is 45 kV, the tube current is 40 mA, the measurement mode is 2θ–ω, and the angular resolution is 0.001 degree step, the diffraction peak of an AlN (002) plane appears at approximately 36.03 degrees, and the diffraction peak of a SiC (102) plane appears at approximately 35.72 degrees.

The diffraction peak between the SiC diffraction peak and the AlN diffraction peak in the $Si_{(1-v-w-x)}C_wAl_xN_v$ layer 12 is higher than the SiC and AlN diffraction peaks in FIG. 2 and is lower than the SiC and AlN diffraction peaks in FIG. 3. As illustrated in FIG. 4, the $Si_{(1-v-w-x)}C_wAl_xN_v$ layer 12 may have only a diffraction peak between the SiC diffraction peak and the AlN diffraction peak without the SiC and AlN diffraction peaks. The diffraction peak between the SiC diffraction peak and the AlN diffraction peak in the $Si_{(1-v-w-x)}C_wAl_xN_v$ layer 12 has such a height that the diffraction peak is not a noise peak, indicating the presence of a mixed crystal of Si, C, Al, and N.

Figure 5:
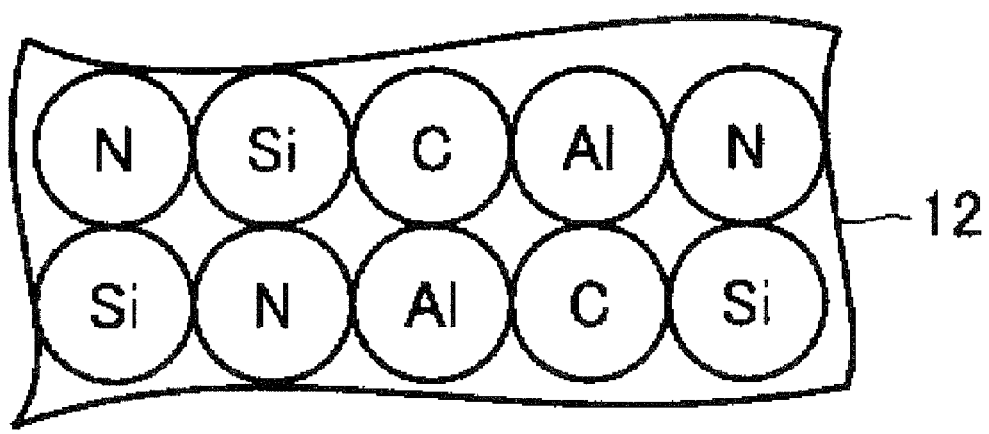
FIG. 5 is a schematic view of the arrangement of atoms constituting the $Si_{(1-v-w-x)}C_wAl_xN_v$ layer according to the first embodiment of the present invention.

FIG. 5 is a schematic view of the arrangement of atoms constituting the $Si_{(1-v-w-x)}C_wAl_xN_v$ layer according to the present embodiment. In general, Si is chemically stable as SiC and therefore easily bonds to C and rarely bonds to N. Al is chemically stable as AlN and therefore easily bonds to N and rarely bonds to C. In the $Si_{(1-v-w-x)}C_wAl_xN_v$ layer 12, however, Si bonds to C and N, and Al bonds to C and N, as illustrated in FIG. 5. Thus, the $Si_{(1-v-w-x)}C_wAl_xN_v$ layer 12 does not aggregate as SiC and AlN, and Si, Al, C, and N are dispersed at the atomic level.

The numbers of cracks each having a size of 1 mm or more in an area 10 mm square of the $Si_{(1-v-w-x)}C_wAl_xN_v$ layer 12 are seven or less for $1>v+x>0.5$, five or less for $0.5 \geq v+x>0.1$, and three or less for $0.1 \geq v+x>0$, wherein v+x denotes the molar ratio of AlN.

The phrase "cracks each having a size of 1 mm or more", as used herein, refers to the total length of one continuous crack in the longitudinal direction.

Figure 6:
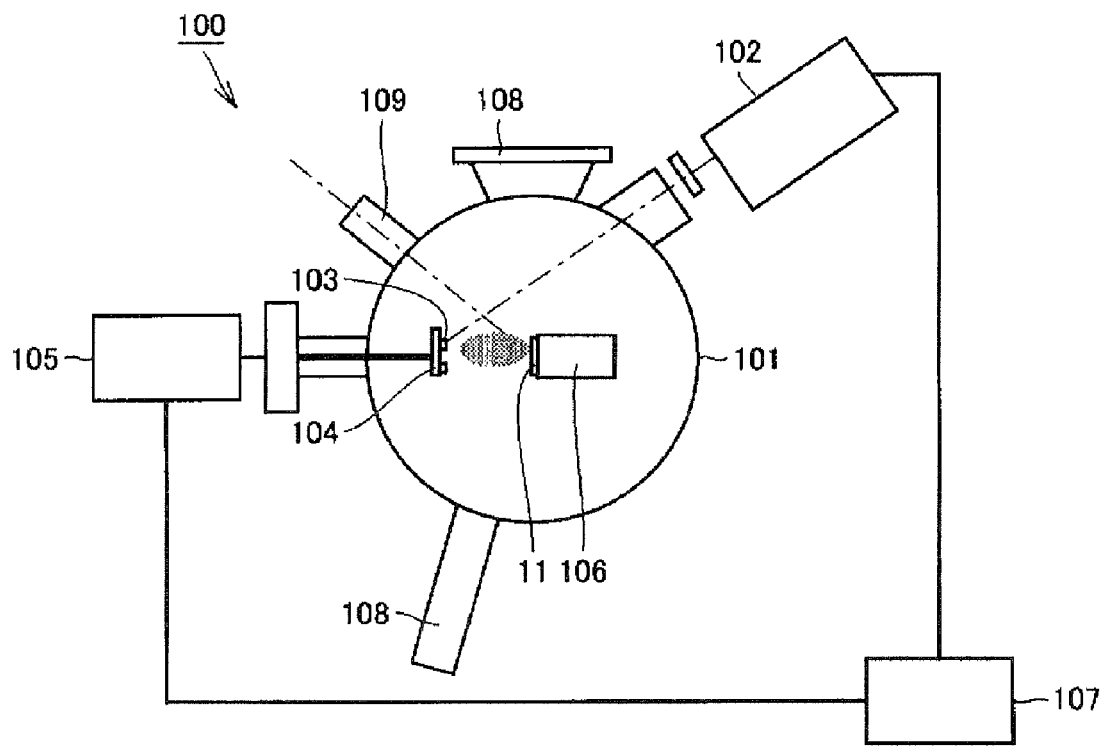
FIG. 6 is a schematic view of a PLD apparatus for use in the manufacture of a $Si_{(1-v-w-x)}C_wAl_xN_v$ substrate according to the first embodiment of the present invention.

A method for manufacturing a $Si_{(1-v-w-x)}C_wAl_xN_v$ substrate 10a according to the present embodiment will be described below with reference to FIG. 6. FIG. 6 is a schematic view of a PLD apparatus for use in the manufacture of the $Si_{(1-v-w-x)}C_wAl_xN_v$ substrate according to the present embodiment.

The main structure of a PLD apparatus 100 will be described below with reference to FIG. 6. As illustrated in FIG. 6, the PLD apparatus 100 includes a vacuum chamber 101, a laser source 102, a raw material 103, a stage 104, a pulse motor 105, a substrate holder 106, a heater (not shown), a controller 107, a reflection high energy electron diffractometer (RHEED) 108, and a gas-supply unit 109.

The laser source 102 is disposed outside the vacuum chamber 101. The laser source 102 can emit a laser beam. The target raw material 103 can be placed in the vacuum chamber 101 such that the raw material 103 can be irradiated with a laser beam from the laser source 102. The raw material 103 can be mounted on the stage 104. The pulse motor 105 can drive the stage 104. The substrate holder 106 can hold the Si substrate 11 as a base substrate. The heater heats the Si substrate 11 in the substrate holder 106. The controller 107 can control the operation of the laser source 102 and the pulse motor 105. The RHEED 108 can monitor oscillations to determine the thickness of the $Si_{(1-v-w-x)}C_wAl_xN_v$ layer 12 grown on the Si substrate 11. The gas-supply unit 109 can supply a gas into the vacuum chamber 101.

The PLD apparatus 100 may include other components. However, for convenience of explanation, these components are not illustrated or described.

First, the raw material 103 for the $Si_{(1-v-w-x)}C_wAl_xN_v$ layer 12 is prepared. For example, the raw material 103 is a sintered compact of a mixture of SiC and AlN. The composition v+x of the $Si_{(1-v-w-x)}C_wAl_xN_v$ layer 12 can depend on the molar ratio of SiC to AlN in the raw material 103. The raw material 103 thus prepared is placed on the stage 104 in FIG. 6.

The Si substrate 11 is placed on the surface of the substrate holder 106 in the vacuum chamber 101 such that the Si substrate 11 faces the raw material 103.

The surface of the Si substrate 11 is then heated to a temperature, for example, below 550° C. The surface temperature of the Si substrate 11 is preferably below 550° C., more preferably 540° C. or less. This heating is performed, for example, with a heater. A method for heating the Si substrate 11 is not limited to a heater and may be another method, for example, the application of an electric current.

The raw material 103 is then irradiated with a laser beam from the laser source 102. The laser may be krypton fluoride (KrF) excimer laser having an emission wavelength of 248 nm, a pulse repetition frequency of 10 Hz, and a pulse energy in the range of 1 to 3 J/shot. Another laser, such as argon fluoride (ArF) excimer laser having an emission wavelength of 193 nm, may also be used.

The vacuum chamber 101 can be evacuated to a pressure in the range of approximately $1 \times 10^{-3}$ to $1 \times 10^{-6}$ Torr or less, for example. The vacuum chamber 101 is then filled with an inert gas, such as argon (Ar), or nitrogen from the gas-supply unit 109. The nitrogen atmosphere in the vacuum chamber 101 can supply nitrogen during the growth of the $Si_{(1-v-w-x)}C_wAl_xN_v$ layer 12. In the inert gas atmosphere in the vacuum chamber, only the raw material 103 is used in the growth of the $Si_{(1-v-w-x)}C_wAl_xN_v$ layer 12. This facilitates the control of v+x.

The raw material 103 is preferably irradiated with a laser beam having a short wavelength as described above. Use of a short-wavelength laser beam increases the absorption coefficient, allowing most of the laser beam to be absorbed in the vicinity of the surface of the raw material 103. This can markedly increase the surface temperature of the raw material 103, generating ablation plasma (plume) in the vacuum chamber 101. Ablation plasma is plasma accompanied by explosive particle emission from a solid. Ablation particles in the plasma move to the Si substrate 11 while the state of the ablation particles alters by recombination, collision with ambient gas, a reaction, or the like. The particles reaching the Si substrate 11 diffuse over the Si substrate 11 and enter acceptor sites to form the $Si_{(1-v-w-x)}C_wAl_xN_v$ layer 12.

The following are acceptor sites for the particles. The acceptor site for an Al atom is a C or N atom binding site. The acceptor site for a Si atom is a C or N atom binding site. The acceptor site for a C atom is an Al or Si atom binding site. The acceptor site for a N atom is an Al or Si atom binding site.

The thickness of the $Si_{(1-v-w-x)}C_wAl_xN_v$ layer 12 to be grown can be monitored through the oscillation of the RHEED 108 installed on the vacuum chamber 101.

Through the steps described above, the $Si_{(1-v-w-x)}C_wAl_xN_v$ layer 12 can be grown on the Si substrate 11 by a PLD method to manufacture the $Si_{(1-v-w-x)}C_wAl_xN_v$ substrate 10a illustrated in FIG. 1.

As described above, a method for manufacturing a $Si_{(1-v-w-x)}C_wAl_xN_v$ substrate 10a according to the present embodiment includes the steps of preparing the Si substrate 11 and growing the $Si_{(1-v-w-x)}C_wAl_xN_v$ layer 12 ($0<v<1$, $0<w<1$, $0<x<1$, and $0<v+w+x<1$) on the Si substrate 11 by a PLD method.

In accordance with a method for manufacturing a $Si_{(1-v-w-x)}C_wAl_xN_v$ substrate 10a according to the present invention, the $Si_{(1-v-w-x)}C_wAl_xN_v$ layer 12 is grown by a PLD method. The raw material 103 for the $Si_{(1-v-w-x)}C_wAl_xN_v$ layer 12 can be irradiated with a laser beam to generate plasma. The plasma can be supplied onto the Si substrate 11. Thus, the $Si_{(1-v-w-x)}C_wAl_xN_v$ layer 12 can be grown in a non-equilibrium state. Unlike the equilibrium state, this non-equilibrium state is not a stable state. Si can therefore bond to C and N, and Al can bond to C and N. Unlike conventional $Si_{(1-v-w-x)}C_wAl_xN_v$ layers 112 illustrated in FIGS. 10 and 11, the $Si_{(1-v-w-x)}C_wAl_xN_v$ layer 12 formed of a mixed crystal of four elements Si, C, Al, and N as illustrated in FIG. 5 can be grown.

The Si substrate 11 is used as a base substrate for the $Si_{(1-v-w-x)}C_wAl_xN_v$ layer 12. The Si substrate 11 is the most commonly used electronic material, and therefore processing techniques, such as etching, have been established for the Si substrate 11. The Si substrate 11 can be easily cleaved and easily etched with an acid. It is therefore easy to reduce the thickness of the Si substrate 11 or remove the Si substrate 11. When the $Si_{(1-v-w-x)}C_wAl_xN_v$ substrate 10a is used in the manufacture of a light-emitting device, the cleavability of the Si substrate is very important. Thus, the easily processable $Si_{(1-v-w-x)}C_wAl_xN_v$ substrate 10a can be manufactured.

The Si substrate 11 is used as a base substrate. The Si substrate 11 is less expensive than SiC substrates and sapphire substrates. This can reduce the manufacturing costs of the $Si_{(1-v-w-x)}C_wAl_xN_v$ substrate 10a.

The method for growing a $Si_{(1-v-w-x)}C_wAl_xN_v$ substrate 10a according to the present embodiment in which a $Si_{(1-v-w-x)}C_wAl_xN_v$ layer 12 is grown by a PLD method can provide a $Si_{(1-v-w-x)}C_wAl_xN_v$ substrate 10a including a $Si_{(1-v-w-x)}C_wAl_xN_v$ layer 12 having a diffraction peak between a SiC diffraction peak and an AlN diffraction peak as determined by an XRD method.

Figure 10:
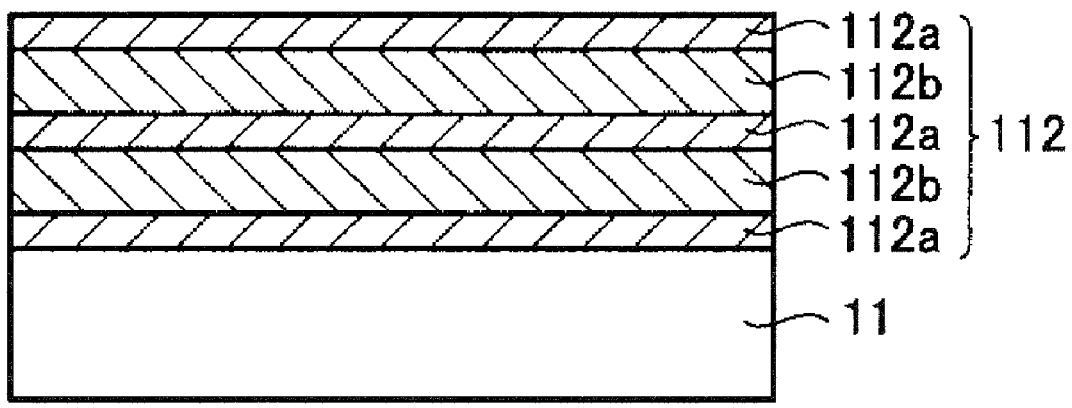
FIG. 10 is a schematic cross-sectional view of a $Si_{(1-v-w-x)}C_wAl_xN_v$ layer grown in Patent Literatures 1 to 3.
Figure 11:
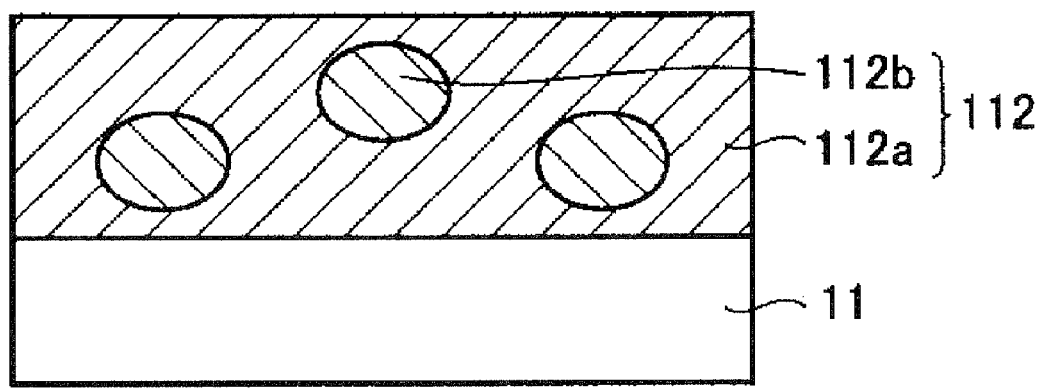
FIG. 11 is a schematic cross-sectional view of a $Si_{(1-v-w-x)}C_wAl_xN_v$ layer grown in Patent Literatures 1 to 3.
Figure 12:
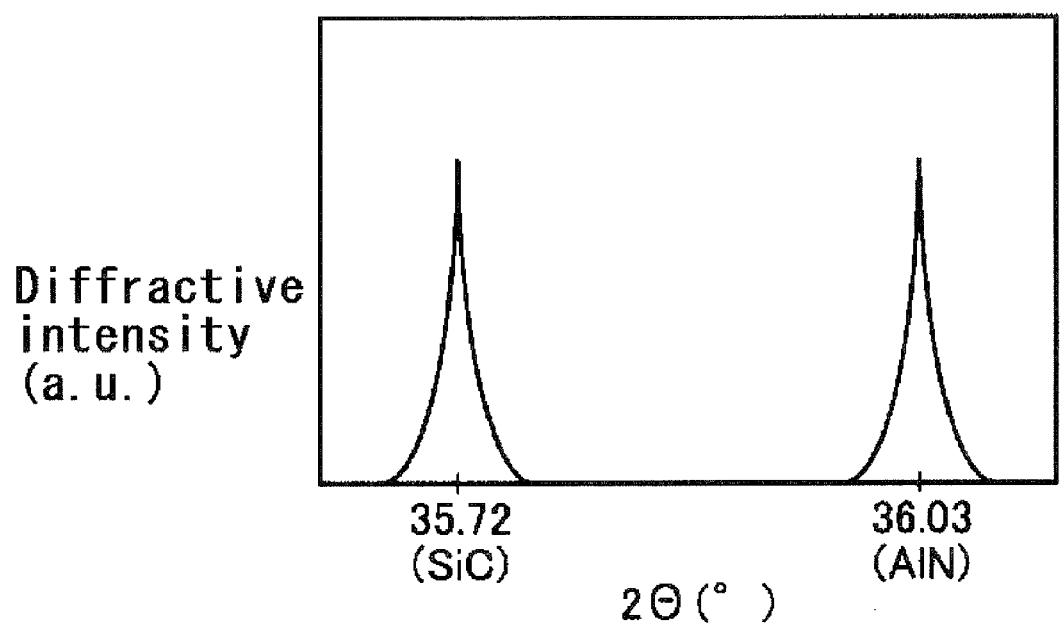
FIG. 12 is a schematic view of the diffraction peaks of a $Si_{(1-v-w-x)}C_wAl_xN_v$ layer grown in an equilibrium state measured by an XRD method.

The diffraction peaks of a $Si_{(1-v-w-x)}C_wAl_xN_v$ layer grown in an equilibrium state, for example, by a conventional sublimation or MBE method will be described below with reference to FIG. 12. FIG. 12 is a schematic view of the diffraction peaks of a $Si_{(1-v-w-x)}C_wAl_xN_v$ layer grown in an equilibrium state measured by an XRD method. More specifically, FIG. 12 is a schematic view of the diffraction peaks of a $(SiC)_{(1-x)}(AlN)_x$ layer 112 illustrated in FIG. 10 or 11 as determined by an XRD method. As illustrated in FIGS. 10 and 11, the $(SiC)_{(1-x)}(AlN)_x$ layer 112 grown in an equilibrium state, for example, by a sublimation method or a MBE method does not have a mixed crystal state of four elements Si, C, Al, and N. Thus, in measurement by an XRD method, as illustrated in FIG. 12, although a SiC diffraction peak and an AlN diffraction peak are observed, no diffraction peak is observed between the SiC diffraction peak and the AlN diffraction peak. A diffraction peak within the limits of error, such as noise, may be observed between the SiC diffraction peak and the AlN diffraction peak.

The $Si_{(1-v-w-x)}C_wAl_xN_v$ layer 12 grown by the PLD method can be the $Si_{(1-v-w-x)}C_wAl_xN_v$ layer 12 in a mixed crystal state of four elements Si, C, Al, and N, as illustrated in FIG. 5. Thus, the $Si_{(1-v-w-x)}C_wAl_xN_v$ substrate 10a including the $Si_{(1-v-w-x)}C_wAl_xN_v$ layer 12 that has a diffraction peak between the SiC diffraction peak and the AlN diffraction peak as determined by an XRD method, as illustrated in FIGS. 2 to 4, can be manufactured.

The $Si_{(1-v-w-x)}C_wAl_xN_v$ substrate 10a manufactured by a method for manufacturing a $Si_{(1-v-w-x)}C_wAl_xN_v$ substrate 10a according to the present embodiment can therefore be easily processed and has improved uniformity of crystal. The $Si_{(1-v-w-x)}C_wAl_xN_v$ substrate 10a can be suitably used in various functional devices that utilize the magnetoresistance effect, such as tunneling magnetoresistive devices and giant magnetoresistive devices; light-emitting devices, such as light-emitting diodes and laser diodes; electronic devices, such as rectifiers, bipolar transistors, field-effect transistors (FETs), spin FETs, and high-electron-mobility transistors (HEMTs); semiconductor sensors, such as temperature sensors, pressure sensors, radiation sensors, and visible-ultraviolet light detectors; and SAW devices.

In the method for manufacturing a $Si_{(1-v-w-x)}C_wAl_xN_v$ substrate 10a, the $Si_{(1-v-w-x)}C_wAl_xN_v$ layer 12 is preferably grown at a temperature below 550° C. in the growing step. The present inventor found that the growth of the $Si_{(1-v-w-x)}C_wAl_xN_v$ layer 12 at a temperature below 550° C. can reduce the stress arising in the $Si_{(1-v-w-x)}C_wAl_xN_v$ layer 12 due to a difference in thermal expansion coefficient between the $Si_{(1-v-w-x)}C_wAl_xN_v$ layer 12 and the Si substrate 11 while the $Si_{(1-v-w-x)}C_wAl_xN_v$ layer 12 is cooled to room temperature after the growth of the $Si_{(1-v-w-x)}C_wAl_xN_v$ layer 12. In other words, the present inventor found that the stress arising in the $Si_{(1-v-w-x)}C_wAl_xN_v$ layer 12 at a growth temperature below 550° C. can prevent cracks from occurring in the $Si_{(1-v-w-x)}C_wAl_xN_v$ layer 12. This can reduce the number of cracks in the $Si_{(1-v-w-x)}C_wAl_xN_v$ layer 12.

In particular, in accordance with a conventional way, it is difficult to grow the $Si_{(1-v-w-x)}C_wAl_xN_v$ layer 12 using the Si substrate 11 as a base substrate because the growth temperature of the $Si_{(1-v-w-x)}C_wAl_xN_v$ layer 12 is high. The growth of the $Si_{(1-v-w-x)}C_wAl_xN_v$ layer 12 at a low temperature below 550° C. can prevent the thermal degradation of the Si substrate 11. Thus, the $Si_{(1-v-w-x)}C_wAl_xN_v$ layer 12 can be grown on the Si substrate 11.

The method for growing a $Si_{(1-v-w-x)}C_wAl_xN_v$ substrate 10a including growing a $Si_{(1-v-w-x)}C_wAl_xN_v$ layer 12 at a temperature below 550° C. according to the present embodiment can provide the $Si_{(1-v-w-x)}C_wAl_xN_v$ substrate 10a having the $Si_{(1-v-w-x)}C_wAl_xN_v$ layer 12 in which the numbers of cracks each having a size of 1 mm or more in an area 10 mm square of the $Si_{(1-v-w-x)}C_wAl_xN_v$ layer are seven or less for $1>v+x>0.5$, five or less for $0.5 \geq v+x>0.1$, and three or less for $0.1 \geq v+x>0$.

Second Embodiment

Figure 7:
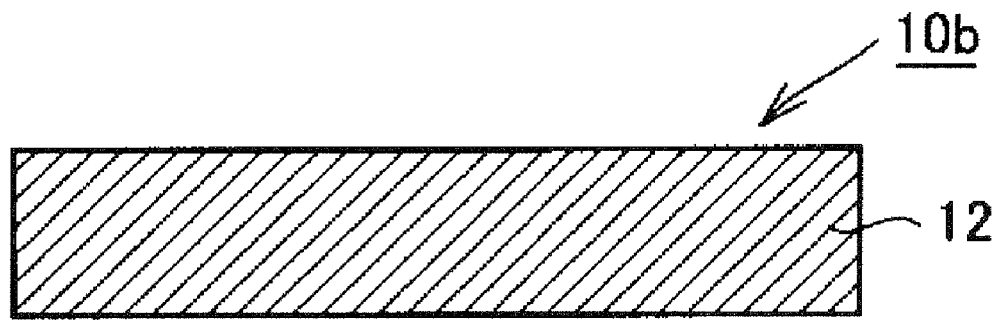
FIG. 7 is a schematic cross-sectional view of a $Si_{(1-v-w-x)}C_wAl_xN_v$ substrate according to a second embodiment of the present invention.

FIG. 7 is a schematic cross-sectional view of a $Si_{(1-v-w-x)}C_wAl_xN_v$ substrate according to a second embodiment of the present invention. With reference to FIG. 7, in a $Si_{(1-v-w-x)}C_wAl_xN_v$ substrate 10b according to the present embodiment, at least the Si substrate 11 is removed from the $Si_{(1-v-w-x)}C_wAl_xN_v$ substrate 10a according to the first embodiment.

A method for manufacturing a $Si_{(1-v-w-x)}C_wAl_xN_v$ substrate 10b according to the present embodiment will be described below.

First, the $Si_{(1-v-w-x)}C_wAl_xN_v$ substrate 10a illustrated in FIG. 1 is manufactured by the method for manufacturing a $Si_{(1-v-w-x)}C_wAl_xN_v$ substrate 10a according to the first embodiment.

The Si substrate 11 is then removed. Only the Si substrate 11 may be removed, or the Si substrate 11 and part of the $Si_{(1-v-w-x)}C_wAl_xN_v$ layer 12 including the surface in contact with the Si substrate 11 may be removed.

The removal can be performed by any method, for example, chemical removal, such as etching, or mechanical removal, such as cutting, grinding, or cleavage. Cutting refers to the mechanical removal of at least the Si substrate 11 from the $Si_{(1-v-w-x)}C_wAl_xN_v$ layer 12 with a slicer having a peripheral cutting edge of an electrodeposited diamond wheel. Grinding refers to applying a rotating whetstone to a surface to scrape the surface in the thickness direction. Cleavage refers to cleaving the Si substrate 11 along the crystal lattice plane.

As described above, a method for manufacturing a $Si_{(1-v-w-x)}C_wAl_xN_v$ substrate 10b according to the present embodiment further includes the step of removing the Si substrate 11. Since the Si substrate 11 can be easily removed, the $Si_{(1-v-w-x)}C_wAl_xN_v$ substrate 10b, for example, including the $Si_{(1-v-w-x)}C_wAl_xN_v$ layer 12 alone can be easily manufactured.

Third Embodiment

Figure 8:
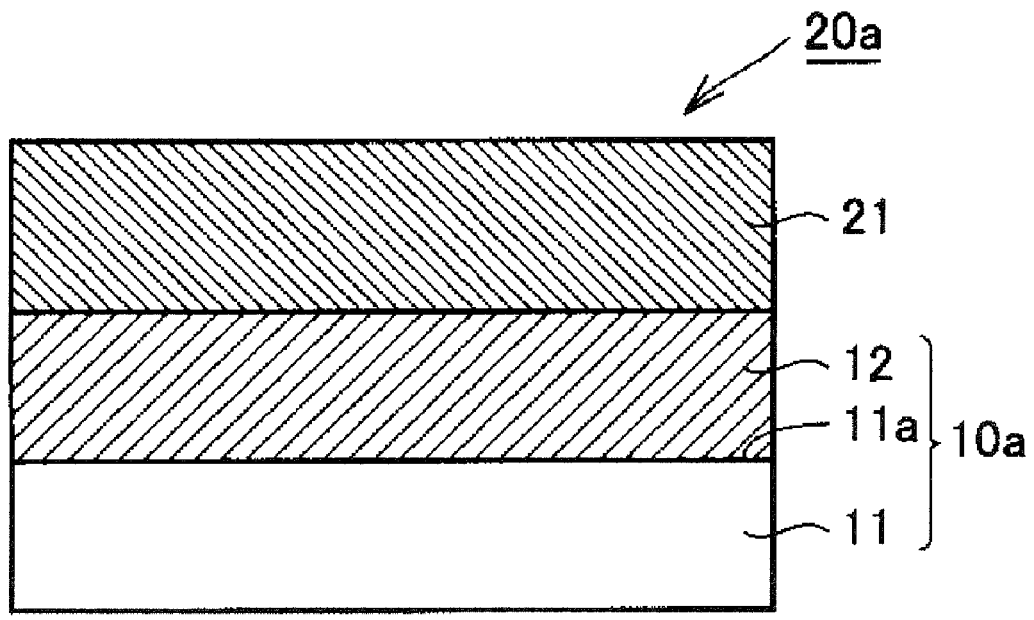
FIG. 8 is a schematic cross-sectional view of an epitaxial wafer according to a third embodiment of the present invention.

FIG. 8 is a schematic cross-sectional view of an epitaxial wafer according to the present embodiment. An epitaxial wafer 20a according to the present embodiment will be described below with reference to FIG. 8.

As illustrated in FIG. 8, the epitaxial wafer 20a includes the $Si_{(1-v-w-x)}C_wAl_xN_v$ substrate 10a according to the first embodiment and an $Al_{(1-x)}(Ga_yIn_z)N$ ($0 \leq y \leq 1$, $0 \leq z \leq 1$, and $0 \leq y+z \leq 1$) layer 21 formed on the $Si_{(1-v-w-x)}C_wAl_xN_v$ substrate 10a. In other words, the epitaxial wafer 20a includes the Si substrate 11, the $Si_{(1-v-w-x)}C_wAl_xN_v$ layer 12 formed on the Si substrate 11, and the $Al_{(1-y-z)}Ga_yIn_zN$ layer 21 formed on the $Si_{(1-v-w-x)}C_wAl_xN_v$ layer 12.

A method for manufacturing an epitaxial wafer 20a according to the present embodiment will be described below.

First, the $Si_{(1-v-w-x)}C_wAl_xN_v$ substrate 10a is manufactured by the method for manufacturing a $Si_{(1-v-w-x)}C_wAl_xN_v$ substrate 10a according to the first embodiment.

The $Al_{(1-y-z)}Ga_yIn_zN$ layer 21 is then grown on the $Si_{(1-v-w-x)}C_wAl_xN_v$ substrate 10a (the $Si_{(1-v-w-x)}C_wAl_xN_v$ layer 12 in the present embodiment). Examples of the growth method include, but not limited to, vapor phase epitaxy methods, such as an MOCVD method, a hydride vapor phase epitaxy (HVPE) method, an MBE method, and a sublimation method, and liquid phase epitaxy methods.

Through these steps, the epitaxial wafer 20a illustrated in FIG. 8 can be manufactured. A step of removing the Si substrate 11 from the epitaxial wafer 20a may be further performed.

As described above, in accordance with the epitaxial wafer 20a and the method for manufacturing an epitaxial wafer 20a according to the present embodiment, the $Al_{(1-y-z)}Ga_yIn_zN$ layer 21 is formed on the $Si_{(1-v-w-x)}C_wAl_xN_v$ substrate 10a. The $Si_{(1-v-w-x)}C_wAl_xN_v$ substrate 10a includes the $Si_{(1-v-w-x)}C_wAl_xN_v$ layer 12 in a mixed crystal state. An $Al_{(1-y-z)}Ga_yIn_zN$ layer 21 having uniform crystallinity can therefore be grown on the $Si_{(1-v-w-x)}C_wAl_xN_v$ layer 12. Furthermore, because differences in lattice matching and thermal expansion coefficient between the $Al_{(1-y-z)}Ga_yIn_zN$ layer and the $Si_{(1-v-w-x)}C_wAl_xN_v$ layer 12 are small, the $Al_{(1-y-z)}Ga_yIn_zN$ layer 21 can have improved crystallinity. In an epitaxial wafer including the Si substrate 11, since the Si substrate 11 can be easily processed, the Si substrate 11 can be easily removed from the epitaxial wafer.

Fourth Embodiment

Figure 9:
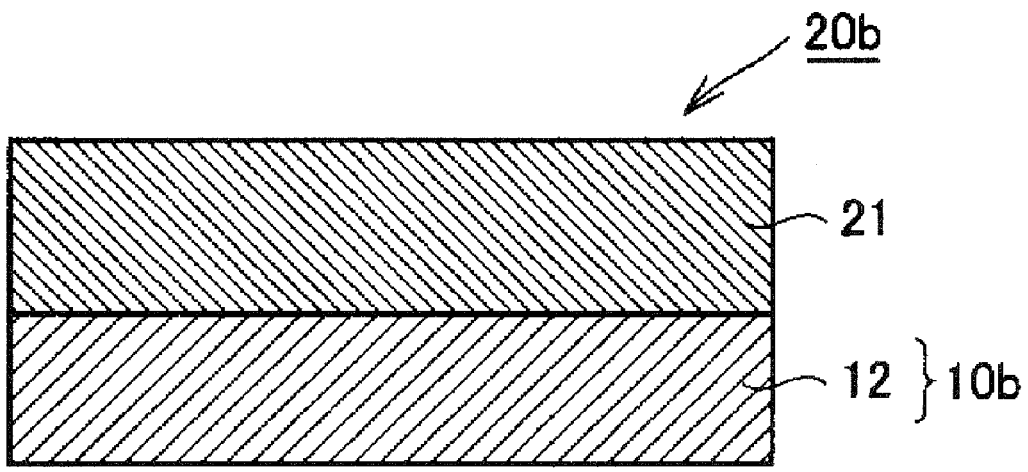
FIG. 9 is a schematic cross-sectional view of an epitaxial wafer according to a fourth embodiment of the present invention.

FIG. 9 is a schematic cross-sectional view of an epitaxial wafer according to the present embodiment. An epitaxial wafer 20b according to the present embodiment will be described below with reference to FIG. 9.

As illustrated in FIG. 9, the epitaxial wafer 20b includes the $Si_{(1-v-w-x)}C_wAl_xN_v$ substrate 10b according to the second embodiment and an $Al_{(1-y-z)}Ga_yIn_zN$ ($0 \leq y \leq 1$, $0 \leq z \leq 1$, and $0 \leq y+z \leq 1$) layer 21 formed on the $Si_{(1-v-w-x)}C_wAl_xN_v$ substrate 10b. In other words, the epitaxial wafer 20b includes the $Si_{(1-v-w-x)}C_wAl_xN_v$ layer 12 and the $Al_{(1-y-z)}Ga_yIn_zN$ layer 21 formed on the $Si_{(1-v-w-x)}C_wAl_xN_v$ layer 12.

A method for manufacturing an epitaxial wafer 20b according to the present embodiment will be described below.

First, the $Si_{(1-v-w-x)}C_wAl_xN_v$ substrate 10b is manufactured by the method for manufacturing a $Si_{(1-v-w-x)}C_wAl_xN_v$ substrate 10b according to the second embodiment.

The $Al_{(1-y-z)}Ga_yIn_zN$ layer 21 is then grown on the $Si_{(1-v-w-x)}C_wAl_xN_v$ substrate 10b (the $Si_{(1-v-w-x)}C_wAl_xN_v$ layer 12 in the present embodiment) as in the third embodiment.

Through these steps, the epitaxial wafer 20b illustrated in FIG. 9 can be manufactured.

As described above, in accordance with the epitaxial wafer 20b and the method for manufacturing an epitaxial wafer 20b according to the present embodiment, the $Al_{(1-y-z)}Ga_yIn_zN$ layer 21 is formed on the $Si_{(1-v-w-x)}C_wAl_xN_v$ substrate 10b. Since the $Si_{(1-v-w-x)}C_wAl_xN_v$ substrate 10b includes the $Si_{(1-v-w-x)}C_wAl_xN_v$ layer 12 in a mixed crystal state, the $Al_{(1-y-z)}Ga_yIn_zN$ layer 21 having uniform crystallinity can be grown.

EXAMPLE 1

The effects of the growth of a $Si_{(1-v-w-x)}C_wAl_xN_v$ layer on a Si substrate was studied in the present example.

WORKING EXAMPLE 1

In Working Example 1, a $Si_{(1-v-w-x)}C_wAl_xN_v$ substrate 10a was basically manufactured by the method for manufacturing a $Si_{(1-v-w-x)}C_wAl_xN_v$ substrate 10a according to the first embodiment with a PLD apparatus illustrated in FIG. 6. $Si_{0.05}C_{0.05}(AlN)_{0.9}$ wherein v+x was 0.9 was produced as a $Si_{(1-v-w-x)}C_wAl_xN_v$ layer 12.

More specifically, the raw material 103 for a $Si_{0.05}C_{0.05}(AlN)_{0.9}$ layer 12 was first prepared. The raw material 103 was prepared in the following way. More specifically, a SiC powder and an AlN powder were mixed and pressed. This mixture was placed in a vacuum vessel. After the vacuum vessel was evacuated to $10^{-6}$ Torr, the atmosphere was filled with a high-purity Ar gas. The mixture was then fired at 2300° C. for 20 hours to prepare the raw material 103. The raw material 103 was placed on the stage 104 illustrated in FIG. 6.

A Si substrate 11 was then prepared as a base substrate. The Si substrate 11 had a (001) plane as a main surface 11a and a size of one inch. The Si substrate 11 was placed on the surface of a substrate holder 106 in a vacuum chamber 101 such that the Si substrate 11 faced the raw material 103.

The surface of the Si substrate 11 was then heated to a temperature of 540° C. The raw material 103 was then irradiated with a laser beam from a laser source 102. The laser was KrF excimer laser having an emission wavelength of 248 nm, a pulse repetition frequency of 10 Hz, and a pulse energy in the range of 1 to 3 J/shot.

In this process, the vacuum chamber 101 was evacuated to $1 \times 10^{-6}$ Torr and was then filled with nitrogen.

The $Si_{0.05}C_{0.05}(AlN)_{0.9}$ layer 12 having a thickness of 500 nm was grown while monitoring the thickness through the oscillation of a RHEED 108 installed on the vacuum chamber 101.

Through the steps described above, a $Si_{0.05}C_{0.05}(AlN)_{0.9}$ substrate 10a illustrated in FIG. 1 was manufactured.

COMPARATIVE EXAMPLE 1

In Comparative Example 1, a $Si_{0.05}C_{0.05}(AlN)_{0.9}$ substrate was manufactured basically in the same manner as in Working Example 1 except that the Si substrate serving as a base substrate was replaced with a sapphire substrate having a (0001) main surface.

COMPARATIVE EXAMPLE 2

In Comparative Example 2, a $Si_{0.05}C_{0.05}(AlN)_{0.9}$ substrate was manufactured basically in the same manner as in Working Example 1 except that the Si substrate serving as a base substrate was replaced with a 6H-SiC substrate having a (0001) main surface.

Measurement Method

The etching characteristics with a hydrogen fluoride (HF) and nitric acid ($HNO_3$) mixture and potassium hydroxide (KOH) and the cleavability of the base substrate of the $Si_{0.05}C_{0.05}(AlN)_{0.9}$ substrate according to Working Example 1, Comparative Example 1, and Comparative Example 2 were examined.

Table I shows the results. In Table I, "Pass" means that the base substrate was successfully removed, and "Fail" means that the base substrate was not successfully removed.

TABLE I

| | Base substrate | HF + $HNO_3$ | KOH | Cleavability |
|---|---|---|---|---|
| Working Example 1 | Si (001) | Pass | Pass | Pass |
| Comparative Example 1 | $Al_2O_3$ (0001) | Fail | Fail | Fail |

TABLE I-continued

| | Base substrate | HF + HNO$_3$ | KOH | Cleavability |
|---|---|---|---|---|
| Comparative Example 2 | 6H—SiC (0001) | Fail | Fail | Pass |

Measurements

Table I shows that the $Si_{0.05}C_{0.05}(AlN)_{0.9}$ substrate according to Working Example 1, which used the Si substrate as the base substrate, exhibited excellent etching characteristics and cleavability of the Si substrate. This showed that the Si substrate could be easily processed.

In contrast, the $Si_{0.05}C_{0.05}(AlN)_{0.9}$ substrate according to Comparative Example 1, which used the sapphire substrate as the base substrate, exhibited poor etching characteristics and cleavability of the sapphire substrate. The sapphire substrate was therefore not sufficiently removed.

The $Si_{0.05}C_{0.05}(AlN)_{0.9}$ substrate according to Comparative Example 2, which used the SiC substrate as the base substrate, exhibited poor etching characteristics of the SiC substrate. The SiC substrate was therefore not sufficiently removed by etching.

Thus, the present example showed that a $Si_{(1-v-w-x)}C_wAl_xN_v$ substrate that can be easily processed can be manufactured using a Si substrate.

EXAMPLE 2

The effects of the growth of a $Si_{(1-v-w-x)}C_wAl_xN_v$ layer at a temperature below 550° C. was studied in the present example.

WORKING EXAMPLE 2

In Working Example 2, $Si_{0.05}C_{0.05}Al_{0.45}N_{0.45}$ was grown basically in the same manner as in Working Example 1 except that a Si substrate 11 having a (111) main surface was used as the base substrate.

WORKING EXAMPLE 3

Working Example 3 was basically the same as Working Example 2 except that the $Si_{(1-v-w-x)}C_wAl_xN_v$ layer 12 grown was $Si_{0.0005}C_{0.0005}Al_{0.4994}N_{0.4996}$. This change was achieved by altering the molar ratio of the AlN powder to the SiC powder in the raw material 103 prepared.

WORKING EXAMPLE 4

Working Example 4 was basically the same as Working Example 2 except that the $Si_{(1-v-w-x)}C_wAl_xN_v$ layer 12 grown was $Si_{0.0005}C_{0.0005}Al_{0.4996}N_{0.4994}$.

WORKING EXAMPLE 5

Working Example 5 was basically the same as Working Example 2 except that the $Si_{(1-v-w-x)}C_wAl_xN_v$ layer 12 grown was $Si_{0.0005}C_{0.0005}Al_{0.4995}N_{0.4995}$.

WORKING EXAMPLE 6

Working Example 6 was basically the same as Working Example 2 except that the $Si_{(1-v-w-x)}C_wAl_xN_v$ layer 12 grown was $Si_{0.0006}C_{0.0004}Al_{0.4995}N_{0.4995}$.

WORKING EXAMPLE 7

Working Example 7 was basically the same as Working Example 2 except that the $Si_{(1-v-w-x)}C_wAl_xN_v$ layer 12 grown was $Si_{0.0004}C_{0.0006}Al_{0.4995}N_{0.4995}$.

WORKING EXAMPLE 8

Working Example 8 was basically the same as Working Example 2 except that the $Si_{(1-v-w-x)}C_wAl_xN_v$ layer 12 grown was $Si_{0.005}C_{0.005}Al_{0.495}N_{0.495}$.

WORKING EXAMPLE 9

Working Example 9 was basically the same as Working Example 1 except that the $Si_{(1-v-w-x)}C_wAl_xN_v$ layer 12 grown was $Si_{0.25}C_{0.25}Al_{0.25}N_{0.25}$.

WORKING EXAMPLE 10

Working Example 10 was basically the same as Working Example 1 except that the $Si_{(1-v-w-x)}C_wAl_xN_v$ layer 12 grown was $Si_{0.45}C_{0.45}Al_{0.05}N_{0.05}$.

WORKING EXAMPLE 11

Working Example 11 was basically the same as Working Example 2 except that the $Si_{(1-v-w-x)}C_wAl_xN_v$ layer 12 grown was $Si_{0.495}C_{0.495}Al_{0.005}N_{0.005}$.

WORKING EXAMPLE 12

Working Example 12 was basically the same as Working Example 2 except that the $Si_{(1-v-w-x)}C_wAl_xN_v$ layer 12 grown was $Si_{0.4995}C_{0.4995}Al_{0.0004}N_{0.0006}$.

WORKING EXAMPLE 13

Working Example 13 was basically the same as Working Example 2 except that the $Si_{(1-v-w-x)}C_wAl_xN_v$ layer 12 grown was $Si_{0.4995}C_{0.4995}Al_{0.0006}N_{0.0004}$.

WORKING EXAMPLE 14

Working Example 14 was basically the same as Working Example 2 except that the $Si_{(1-v-w-x)}C_wAl_xN_v$ layer 12 grown was $Si_{0.4995}C_{0.4995}Al_{0.0005}N_{0.0005}$.

WORKING EXAMPLE 15

Working Example 15 was basically the same as Working Example 2 except that the $Si_{(1-v-w-x)}C_wAl_xN_v$ layer 12 grown was $Si_{0.4996}C_{0.4994}Al_{0.0005}N_{0.0005}$.

WORKING EXAMPLE 16

Working Example 16 was basically the same as Working Example 2 except that the $Si_{(1-v-w-x)}C_wAl_xN_v$ layer 12 grown was $Si_{0.4994}C_{0.4996}Al_{0.0005}N_{0.0005}$.

WORKING EXAMPLE 17

Working Example 17 was basically the same as Working Example 2 except that the $Si_{0.05}C_{0.05}Al_{0.45}N_{0.45}$ layer was grown at a temperature of the main surface of the Si substrate of 550° C.

WORKING EXAMPLE 18

Working Example 18 was basically the same as Working Example 2 except that a $Si_{0.0005}C_{0.0005}Al_{0.4994}N_{0.4996}$ layer was grown at a temperature of the main surface of the Si substrate of 550° C.

WORKING EXAMPLE 19

Working Example 19 was basically the same as Working Example 2 except that a $Si_{0.0005}C_{0.0005}Al_{0.4996}N_{0.4994}$ layer was grown at a temperature of the main surface of the Si substrate of 550° C.

WORKING EXAMPLE 20

Working Example 20 was basically the same as Working Example 2 except that a $Si_{0.0005}C_{0.0005}Al_{0.4995}N_{0.4995}$ layer was grown at a temperature of the main surface of the Si substrate of 550° C.

WORKING EXAMPLE 21

Working Example 21 was basically the same as Working Example 2 except that a $Si_{0.0006}C_{0.0004}Al_{0.4995}N_{0.4995}$ layer was grown at a temperature of the main surface of the Si substrate of 550° C.

WORKING EXAMPLE 22

Working Example 22 was basically the same as Working Example 2 except that a $Si_{0.0004}C_{0.0006}Al_{0.4995}N_{0.4995}$ layer was grown at a temperature of the main surface of the Si substrate of 550° C.

WORKING EXAMPLE 23

Working Example 23 was basically the same as Working Example 2 except that a $Si_{0.005}C_{0.005}Al_{0.495}N_{0.495}$ layer was grown at a temperature of the main surface of the Si substrate of 550° C.

WORKING EXAMPLE 24

Working Example 24 was basically the same as Working Example 2 except that a $Si_{0.25}C_{0.25}Al_{0.25}N_{0.25}$ layer was grown at a temperature of the main surface of the Si substrate of 550° C.

WORKING EXAMPLE 25

Working Example 25 was basically the same as Working Example 2 except that a $Si_{0.45}C_{0.45}Al_{0.05}N_{0.05}$ layer was grown at a temperature of the main surface of the Si substrate of 550° C.

WORKING EXAMPLE 26

Working Example 26 was basically the same as Working Example 2 except that a $Si_{0.495}C_{0.495}Al_{0.005}N_{0.005}$ layer was grown at a temperature of the main surface of the Si substrate of 550° C.

WORKING EXAMPLE 27

Working Example 27 was basically the same as Working Example 2 except that a $Si_{0.4995}C_{0.4995}Al_{0.0004}N_{0.0006}$ layer was grown at a temperature of the main surface of the Si substrate of 550° C.

WORKING EXAMPLE 28

Working Example 28 was basically the same as Working Example 2 except that a $Si_{0.4995}C_{0.4995}Al_{0.0006}N_{0.0004}$ layer was grown at a temperature of the main surface of the Si substrate of 550° C.

WORKING EXAMPLE 29

Working Example 29 was basically the same as Working Example 2 except that a $Si_{0.4995}C_{0.4995}Al_{0.0005}N_{0.0005}$ layer was grown at a temperature of the main surface of the Si substrate of 550° C.

WORKING EXAMPLE 30

Working Example 30 was basically the same as Working Example 2 except that a $Si_{0.4996}C_{0.4994}Al_{0.0005}N_{0.0005}$ layer was grown at a temperature of the main surface of the Si substrate of 550° C.

WORKING EXAMPLE 31

Working Example 31 was basically the same as Working Example 2 except that a $Si_{0.4994}C_{0.4996}Al_{0.0005}N_{0.0005}$ layer was grown at a temperature of the main surface of the Si substrate of 550° C.

COMPARATIVE EXAMPLE 3

Comparative Example 3 was basically the same as Working Example 2 except that an AlN layer was grown at a temperature of the main surface of the Si substrate of 540° C.

COMPARATIVE EXAMPLE 4

Comparative Example 4 was basically the same as Working Example 2 except that an AlN layer was grown at a temperature of the main surface of the Si substrate of 550° C.

COMPARATIVE EXAMPLE 5

Comparative Example 5 was basically the same as Working Example 2 except that a SiC layer was grown at a temperature of the main surface of the Si substrate of 540° C.

COMPARATIVE EXAMPLE 6

Comparative Example 6 was basically the same as Working Example 2 except that a SiC layer was grown at a temperature of the main surface of the Si substrate of 550° C.

Measurement Method

The number of cracks in a region 10 mm square of the $Si_{(1-v-w-x)}C_wAl_xN_v$ layer, the AlN layer, and the SiC layer in Working Examples 2 to 31 and Comparative Examples 3 to 6 was counted under an optical microscope. Cracks each having a total length of 1 mm or more in the longitudinal direction were counted, and cracks each having a total length below 1 mm were not counted. Table II shows the results.

TABLE II

| Substrate temperature (°C) | AlN | $Si_{0.0005}C_{0.0005}Al_{0.4994}N_{0.4996}$ | $Si_{0.0005}C_{0.0005}Al_{0.4996}N_{0.4994}$ | $Si_{0.0005}C_{0.0005}Al_{0.4995}N_{0.4995}$ | $Si_{0.0006}C_{0.0004}Al_{0.4995}N_{0.4995}$ | $Si_{0.0004}C_{0.0006}Al_{0.4995}N_{0.4995}$ | $Si_{0.005}C_{0.005}Al_{0.495}N_{0.495}$ | $Si_{0.05}C_{0.05}Al_{0.45}N_{0.45}$ | $Si_{0.25}C_{0.25}Al_{0.25}N_{0.25}$ |
|---|---|---|---|---|---|---|---|---|---|
| 550 | 10 | 8 | 8 | 8 | 8 | 8 | 8 | 8 | 6 |
| 540 | 10 | 7 | 7 | 7 | 7 | 7 | 7 | 7 | 5 |

| Substrate temperature (°C) | $Si_{0.45}C_{0.45}Al_{0.05}N_{0.05}$ | $Si_{0.495}C_{0.495}Al_{0.005}N_{0.005}$ | $Si_{0.4995}C_{0.4995}Al_{0.0004}N_{0.0006}$ | $Si_{0.4995}C_{0.4995}Al_{0.0006}N_{0.0004}$ | $Si_{0.4995}C_{0.4995}Al_{0.0005}N_{0.0005}$ | $Si_{0.4996}C_{0.4994}Al_{0.0005}N_{0.0005}$ | $Si_{0.4994}C_{0.4996}Al_{0.0005}N_{0.0005}$ | SiC |
|---|---|---|---|---|---|---|---|---|
| 550 | 4 | 4 | 4 | 4 | 4 | 4 | 4 | 2 |
| 540 | 3 | 3 | 3 | 3 | 3 | 3 | 3 | 2 |

Measurements

Table II shows that the number of cracks in the $Si_{(1-v-w-x)}C_wAl_xN_v$ layer in which v+x was 0.9, 0.999, or 0.99 grown at 540° C. in Working Examples 2 to 8 was seven. In contrast, the number of cracks in the $Si_{(1-v-w-x)}C_wAl_xN_v$ layer in which v+x was 0.9, 0.999, or 0.99 grown at 550° C. in Comparative Examples 17 to 23 was eight.

The number of cracks in the $Si_{0.25}C_{0.25}Al_{0.25}N_{0.25}$ layer grown at 540° C. in Working Example 9 was five. In contrast, the number of cracks in the $Si_{0.25}C_{0.25}Al_{0.25}N_{0.25}$ layer, which had the same composition as in Working Example 5, grown at 550° C. in Comparative Example 24 was six.

The number of cracks in the $Si_{(1-v-w-x)}C_wAl_xN_v$ layer in which v+x was 0.1, 0.01, or 0.001 grown at 540° C. in Working Examples 10 to 16 was three. In contrast, the number of cracks in the $Si_{(1-v-w-x)}C_wAl_xN_v$ layer in which v+x was 0.1, 0.01, or 0.001 grown at 550° C. in Comparative Examples 25 to 31 was four.

Thus, it was found that in the growth of a $Si_{(1-v-w-x)}C_wAl_xN_v$ layer having a certain composition (0<v<1, 0<w<1, 0<x<1, and 0<v+w+x<1), the growth temperature below 550° C. resulted in a reduced number of cracks.

A $Si_{(1-v-w-x)}C_wAl_xN_v$ layer having a larger v+x has a larger difference in composition from the Si substrate 11, resulting in an increased number of cracks. Table II shows that the numbers of cracks in a $Si_{(1-v-w-x)}C_wAl_xN_v$ layer grown at 540° C. were seven or less for 1>v+x>0.5, five or less for 0.5≧v+x>0.1, and three or less for 0.1≧v+x>0.

Comparative Examples 3 and 4 where AlN was grown at 540° C. and 550° C. had the same number of cracks, that is, ten. Comparative Examples 5 and 6 where SiC was grown at 540° C. and 550° C. had the same number of cracks, that is, two. These results show that a $Si_{(1-v-w-x)}C_wAl_xN_v$ layer having v+x=0 or v+x=1 could not reduce the number of cracks even at a growth temperature below 550° C.

Thus, the present example showed that a $Si_{(1-v-w-x)}C_wAl_xN_v$ layer (0<v+x<1) grown at a temperature below 550° C. can reduce the number of cracks in the $Si_{(1-v-w-x)}C_wAl_xN_v$ layer (0<v+x<1).

Although the embodiments and examples of the present invention have been described, combinations of features of the embodiments and examples were also originally envisaged. It is to be understood that the embodiments and examples disclosed herein are illustrated by way of example and not by way of limitation in all respects. The scope of the present invention is defined by the appended claims rather than by the embodiments described above. All changes that fall within the scope of the claims and the equivalence thereof are therefore intended to be embraced by the claims.

| Reference Signs List | |
|---|---|
| 10a, 10b | $Si_{(1-v-w-x)}C_wAl_xN_v$ substrate |
| 11 | Si substrate |
| 11a | Main surface |
| 12 | $Si_{(1-v-w-x)}C_wAl_xN_v$ layer |
| 20a, 20b | epitaxial wafer |
| 21 | $Al_{(1-y-z)}Ga_yIn_zN$ layer |
| 100 | PLD apparatus |
| 101 | Vacuum chamber |
| 102 | Laser source |
| 103 | Raw material |
| 104 | Stage |
| 105 | Pulse motor |
| 106 | Substrate holder |
| 107 | Controller |
| 109 | Gas-supply unit |

The invention claimed is:

1. A method for manufacturing a $Si_{(1-v-w-x)}C_wAl_xN_v$ substrate, comprising the steps of:
    preparing a Si substrate; and
    growing a $Si_{(1-v-w-x)}C_wAl_xN_v$ layer (0<v<1, 0<w<1, 0<x<1, and 0<v+w+x<1) on the Si substrate by a pulsed laser deposition method,
    wherein the $Si_{(1-v-w-x)}C_wAl_xN_v$ layer is grown in a mixed crystal layer state, and
    wherein the $Si_{(1-v-w-x)}C_wAl_xN_v$ layer has a composition range 0.001 ≦v+x≦0.1.

2. The method for manufacturing a $Si_{(1-v-w-x)}C_wAl_xN_v$ substrate according to claim 1, further comprising the step of removing the Si substrate after the growing step.

3. A method for manufacturing an epitaxial wafer, comprising the steps of:
    manufacturing a $Si_{(1-v-w-x)}C_wAl_xN_v$ substrate by a method for manufacturing a $Si_{(1-v-w-x)}C_wAl_xN_v$ substrate according to claim 1; and
    growing an $Al_{(1-y-z)}Ga_yIn_zN$ layer (0≦y≦1, 0≦z≦1, and 0≦y+z≦1) on the $Si_{(1-v-w-x)}C_wAl_xN_v$ layer.

* * * * *

UNITED STATES PATENT AND TRADEMARK OFFICE
CERTIFICATE OF CORRECTION

PATENT NO.         : 8,357,597 B2
APPLICATION NO.    : 12/989039
DATED              : January 22, 2013
INVENTOR(S)        : Issei Satoh et al.

It is certified that error appears in the above-identified patent and that said Letters Patent is hereby corrected as shown below:

Title page: Item 54 replace "PROCESS FOR PRODUCING $SI_{(1-v-w-x)}C_wAL_xN_v$ BASE MATERIAL, PROCESS FOR PRODUCING EPITAXIAL WAFER, $SI_{(1-v-w-x)}C_wAL_xN_v$ BASE MATERIAL, AND EPITAXIAL WAFER" with --Process for Producing $Si_{(1-v-w-x)}C_wAl_xN_v$ Base Material, Process for Producing Epitaxial Wafer, $Si_{(1-v-w-x)}C_wAl_xN_v$ Base Material, and Epitaxial Wafer--.

Column 16, Line 48, Claim 1, replace "$Sio_{-v-w}-x)C,Al_xN_v$" with --$Si_{(1-v-w-x)}C_wAl_xN_v$--.

Signed and Sealed this
Ninth Day of April, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,357,597 B2  
APPLICATION NO. : 12/989039  
DATED : January 22, 2013  
INVENTOR(S) : Issei Satoh et al.

It is certified that error appears in the above-identified patent and that said Letters Patent is hereby corrected as shown below:

Title page:

Item 54 and at Column 1, lines 1-5, Title, replace "PROCESS FOR PRODUCING $SI_{(1-v-w-x)}C_wAL_xN_v$ BASE MATERIAL, PROCESS FOR PRODUCING EPITAXIAL WAFER, $SI_{(1-v-w-x)}C_wAL_xN_v$ BASE MATERIAL, AND EPITAXIAL WAFER" with --Process for Producing $Si_{(1-v-w-x)}C_wAl_xN_v$ Base Material, Process for Producing Epitaxial Wafer, $Si_{(1-v-w-x)}C_wAl_xN_v$ Base Material, and Epitaxial Wafer--.

In the Claims:

Column 16, Line 48, Claim 1, replace "$Sio_{-v-w}-x)C_wAl_xN_v$" with --$Si_{(1-v-w-x)}C_wAl_xN_v$--.

This certificate supersedes the Certificate of Correction issued April 9, 2013.

Signed and Sealed this  
Thirtieth Day of April, 2013

Teresa Stanek Rea  
*Acting Director of the United States Patent and Trademark Office*